United States Patent [19]

Tsuji et al.

[11] Patent Number: 4,672,584
[45] Date of Patent: Jun. 9, 1987

[54] CMOS INTEGRATED CIRCUIT

[75] Inventors: Kazuhiko Tsuji, Katano; Seiji Yamaguchi, Hirakata; Eisuke Ichinohe, Katano, all of Japan

[73] Assignee: Matsushita Electric Industrial Co., Ltd., Kadoma, Japan

[21] Appl. No.: 691,701

[22] Filed: Jan. 15, 1985

[30] Foreign Application Priority Data

Jan. 20, 1984 [JP] Japan .................................. 59-8721

[51] Int. Cl.$^4$ ........................................... H01L 27/02
[52] U.S. Cl. ..................................... 365/226; 357/42; 357/43
[58] Field of Search ................... 365/226; 357/41, 42, 357/43

[56] References Cited

U.S. PATENT DOCUMENTS

| | | | |
|---|---|---|---|
| 4,261,004 | 4/1981 | Masuhara et al. | 357/41 X |
| 4,327,368 | 4/1982 | Uchida | 357/42 |
| 4,524,377 | 6/1982 | Eguchi | 357/42 X |

Primary Examiner—Joseph A. Popek
Attorney, Agent, or Firm—Wenderoth, Lind & Ponack

[57] ABSTRACT

A CMOS integrated circuit includes a P-channel type MOS transistor which is formed on an N-type silicon substrate, an N-channel type MOS transistor which is formed on a P well formed in the substrate, and parasitic bipolar transistors which are electrically connected to each other to form a kind of thyristor structure. A power supply voltage is applied to a source electrode of the P-channel type MOS transistor through a part of the substrate which presents a resistance. The resistance is electrically connected to the parasitic bipolar transistor of the thyristor structure to thereby prevent the occurrence of a latch-up phenomenon in which a large current continuously flows through the parasitic bipolar transistors and may destroy the CMOS integrated circuit. Because of the prevention of the latch-up phenomenon, the CMOS integrated circuit is always maintained in good condition.

16 Claims, 9 Drawing Figures

CMOS INTEGRATED CIRCUIT

BACKGROUND OF THE INVENTION

The present invention relates generally to a complementary metal oxide semiconductor (CMOS) integrated circuit, and more particularly to a CMOS integrated circuit in which a latch-up phenomenon does not occur while maintaining high density and high integration.

Integrated circuits have been progressed in density, integration and performance in recent years. To further move forward with such progress, the fining of the elements which form an integrated circuit and the regions between the elements is necessary. That is, the dimensions of such elements and regions must be decreased.

In general, a CMOS integrated circuit includes P-channel and N-channel MOS transistors which are formed on the same semiconductor substrate. Because of such a structure, parasitic bipolar transistors of the PNP and NPN type are formed in the CMOS integrated circuit. The parasitic bipolar transistors form a parasitic PNPN structure, i.e., a thyristor structure. In such a CMOS integrated circuit, electrons or holes are produced in a semiconductor substrate due to external noise or sudden voltage changes in a power supply line, etc.. The electrons or holes are supplied to the parasitic bipolar transistors of the thyristor structure and the parasitic bipolar transistor are rendered conductive. As a result, the thyristor becomes operative and a large current flows through the thyristor to, in some cases, destroy the CMOS integrated circuit. This phenomenon is generally called a "latch-up phenomenon".

To prevent the occurrence of such a latch-up phenomenon, impurity diffusion layers, which are generally called guard bands, are formed at a region between a P-channel MOS transistor and an N-channel MOS transistor in such manner that the guard bands surround the MOS transistors. That is, guard bands electrically separate regions of the P channel and N channel type MOS transistors to thereby prevent the occurrence of the latch-up phenomenon.

However, forming the guard bands makes the size or dimensions of a CMOS integrated circuit larger and prevent a CMOS integrated circuit from being improved by increasing its density and integration.

SUMMARY OF THE INVENTION

Accordingly, it is an object of the present invention to provide a CMOS integrated circuit which is capable of preventing the occurrence of the latch-up phenomenon by the use of a simple structure, without the use of guard bands.

This and other objects of the invention are accomplished by a CMOS integrated circuit which comprises a semiconductor substrate of a first conductivity type, an impurity region of a second conductivity type which is formed in the semiconductor substrate, a first MOS transistor formed in the substrate, a second MOS transistor formed in the impurity region, a power supply means for supplying power voltage to the first and second transistors and at least one resistor formed in at least one of the substrate and impurity region at a position below at least one of the first and second transistors. The resistor is electrically inserted between the power supply means and at least one of the first and second transistors. In specific embodiments thereof, the semiconductor substrate is either N type or P type. The impurity region is P type or N type, respectively. The first MOS transistor is a P channel type or a N channel type. The second MOS transistor an N channel type or a P channel type. The power supply means includes a power supply line and a ground line, and the power supply line is connected to the first MOS transistor through a resistor. The ground line is connected to the second MOS transistor through a resistor. The resistor is formed by the use of a part of at least one of the semiconductor substrate and the impurity diffusion region. The first and second MOS transistors form a complementary circuit.

In another specific embodiment, a CMOS integrated circuit comprises an N type silicon substrate, a P well formed in the substrate, a CMOS circuit including a P channel type MOS transistor which is formed in the substrate and an N channel type MOS transistor which is formed in the P well, a power supply line to which a voltage is applied, a first terminal electrode formed in the substrate away from the CMOS circuit portion, the first electrode being electrically connected to the power supply line, and a second terminal electrode formed in P well away from the CMOS circuit portion, the second terminal electrode being electrically connected to ground. By use of such a structure, a part of the substrate located between the first terminal electrode and CMOS circuit portion, and a part of the P well located between the CMOS circuit portion and the second terminal electrode function as resistors for preventing the occurrence of the latch-up phenomenon of the CMOS integrated circuit. In still another specific embodiment, a CMOS integrated circuit comprises a P type silicon substrate, an N well formed in the substrate, a CMOS circuit including an N channel type MOS transistor which is formed in the substrate and a P channel type MOS transistor which is formed in the N well, a power supply line to which voltage is applied, and a terminal electrode formed in the N well away from said CMOS circuit portion. The electrode is electrically connected to the power supply line. By use of such a structure, a part of the N well located between the CMOS circuit portion and terminal electrode functions as a resistor for preventing the occurrence of the latch-up phenomenon of the CMOS integrated circuit. In still another specific embodiment, a semiconductor memory device comprises a semiconductor substrate, a plurality of memory cells which are comprised of CMOS structure and formed in the substrate, and a power supply line for supplying voltage to the memory cells, the power supply line being formed at a position away from the memory cells and electrically connected to the memory cells through a portion of the substrate which is located below the memory cells. By use of such a structure, a portion of the substrate functions as a resistor for preventing the occurrence of the latch-up phenomenon of the memory cells.

The novel CMOS integrated circuit as described above yields the following advantages. This is, it is possible to prevent occurrence of the latch-up phenomenon by the use of a simple structure, without the use of guard bands. That is, a part of the semiconductor substrate and/or a part of the impurity diffusion region functions as a resistor for preventing the occurrence of the latch-up phenomenon.

While the novel features of the invention are set forth with particularity in the appended claims, the invention, both as a to organization and contents, will be better

DESCRIPTION OF THE PREFERRED EMBODIMENTS

Figure 1:
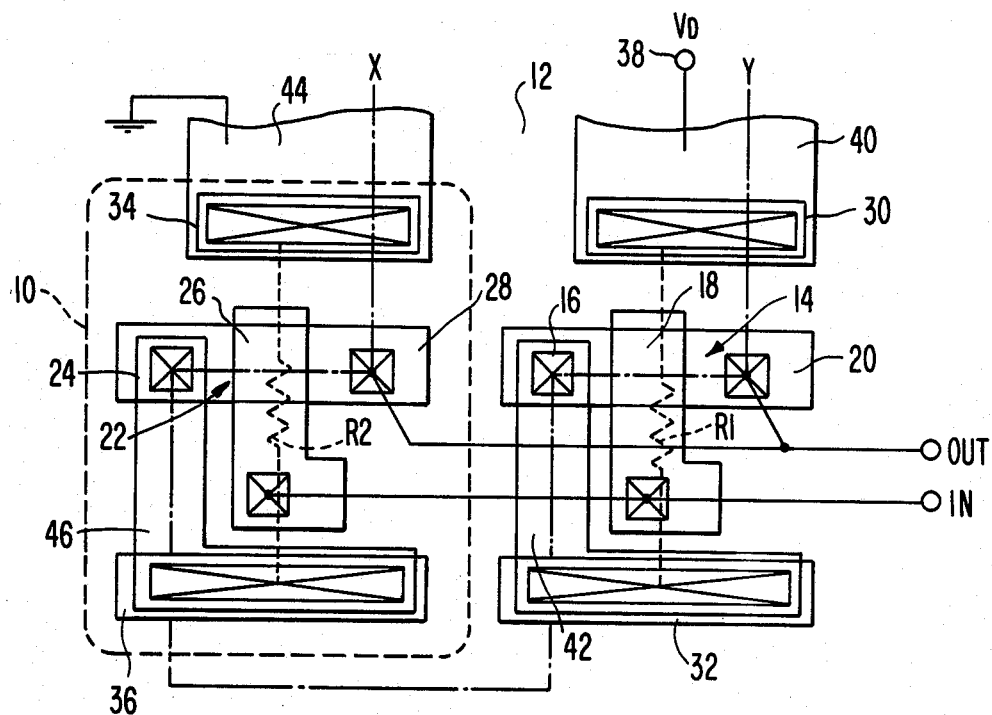
FIG. 1 is a schematic plan view of a CMOS integrated circuit according to the present invention.
Figure 2:
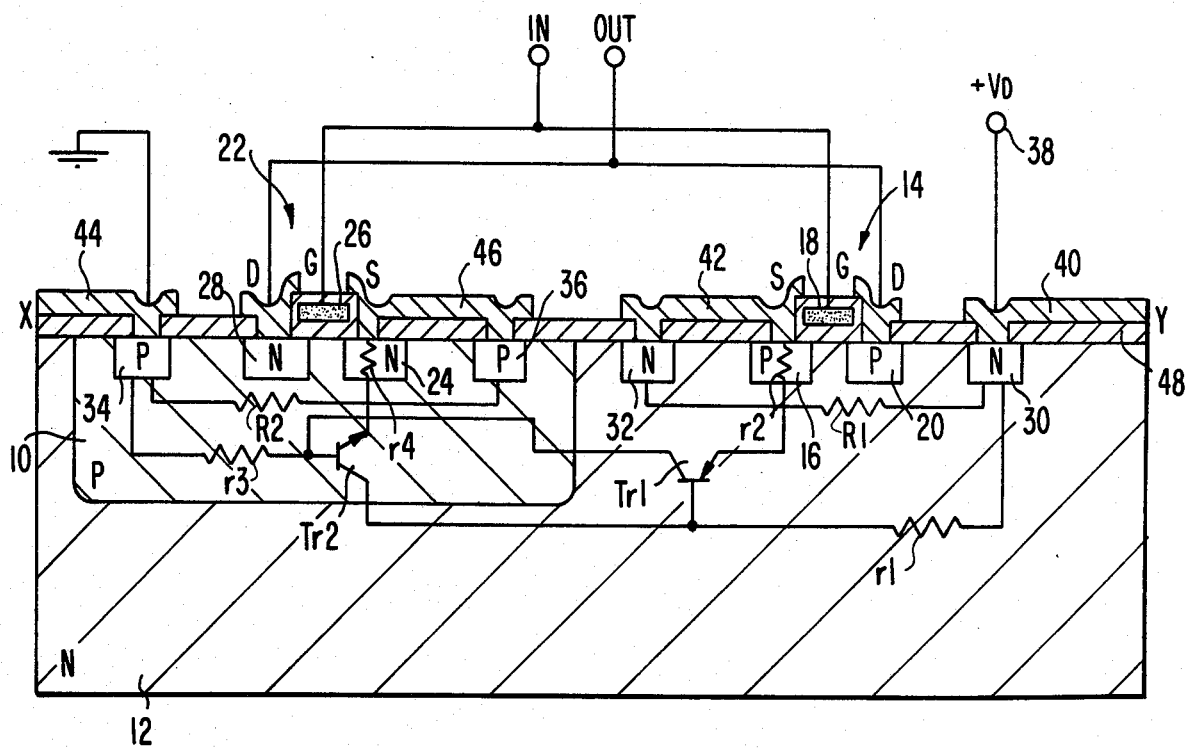
FIG. 2 is a sectional view of the CMOS integrated circuit taken along the line X-Y in FIG. 1.

Referring to FIGS. 1 and 2, a P type impurity diffusion layer, i.e., P well 10, is formed in an N type silicon substrate 12. A P channel type MOS transistor 14 is formed in the substrate 12. The P channel type MOS transistor 14 has a source 16, gate 18 and drain 20. The source 16 and drain 20 are formed in the N type silicon substrate, and the gate 18 is formed by a polysilicon layer. On the other hand, N channel type MOS transistor 22 is formed in the P well 10. The N channel type MOS transistor 22 has a source 24, gate 26 and drain 28. The source 24 and drain 28 are formed by P type impurity regions, and the gate 26 is formed by a polysilicon layer. The P channel type MOS transistor 14 and N channel type MOS transistor 22 are electrically connected in such manner that gates 18 and 26 are connected to each other as an input and drains 20 and 28 are connected to each other as an output, to thereby form a complementary MOS device, i.e., a CMOS circuit. N type impurity regions 30 and 32 are formed in the substrate 12 at the same time that the source 24, and drain 28 of the N channel type MOS transistor 22 is formed in the P well 10. P type impurity regions 34 and 36 are formed in the P well 10 at the same time that the source 16, drain 20 of the P channel type MOS transistor 14 is formed in the substrate 12. The N type impurity region 30 is electrically connected to a power supply terminal 38 to which a voltage V is applied through an aluminum layer 40. The N type impurity region 32 is electrically connected to the source 16 through an aluminum layer 42. The P type impurity region 34 is electrically connected to ground or another power supply terminal to which a voltage Vs is applied, through an aluminum layer 44. The P type impurity region 36 is electrically connected to the source 24 through an aluminum layer 46. The impurity regions 30, 32, 34 and 36 present ohmic characteristic to thereby make the contacts between the aluminum layer and substrate 12 or P well 10 better. Layer 48 is an oxidized layer used as an insulation layer.

According to such a CMOS circuit structure, parasitic bipolar transistors $Tr_1$ and $Tr_2$, resistors $r_1, r_2, r_3, r_4, R_1$ and $R_2$ are produced. The parasitic bipolar transistor $Tr_1$ is of the PNP type and is formed by the source 16 (P type), the substrate 12 (N type) and the P well 10. The resistor $r_1$ is formed by the resistance which is produced by the N type impurity region 30 and by a part of the substrate 12 which is located between the impurity region 30 and an area proximate to both the source 16 and the P well 10. The resistor $r_2$ is formed by the resistance which is produced by the source 16 of the P channel type MOS transistor 14. The resistor $r_3$ is formed by the resistance which is produced by the P type impurity region 34 and by a part of the P well 10 which is located between the impurity region 34 and an area proximate to both the source 24 and the substrate 12. The resistor $r_4$ is formed by the resistance which is produced by the source 24 of the N channel type MOS transistor 22.

Figure 4:
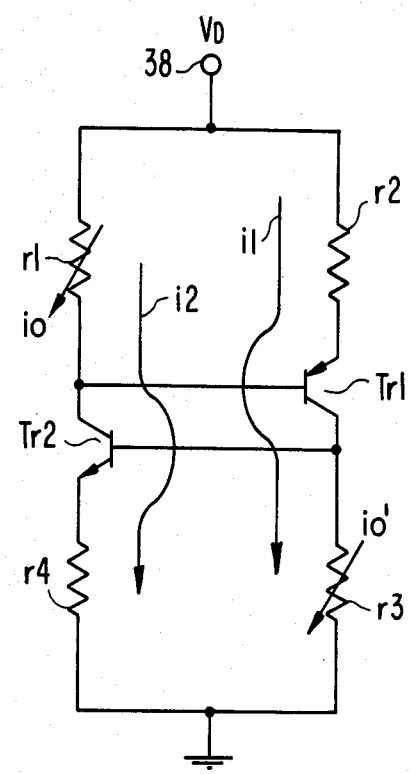
FIG. 4 is a circuit diagram of a CMOS integrated circuit for explaining the latch-up phenomenon.

By the above-stated elements including transistors $Tr_1$ and $Tr_2$ and resistors $r_1 \sim r_4$, the thyristor structure shown in FIG. 4 is formed. That is, terminal 38 is connected to ground through a first serial connection of resistor $r_2$, transistor $Tr_1$ and resistor $r_3$, and through a second serial connection of resistor $r_1$, transistor $Tr_2$ and resistor $r_4$. The base of transistor $Tr_1$ is connected to the collector of transistor $Tr_2$, and the base of transistor $Tr_2$ is connected to the collector of transistor $Tr_1$.

The latch-up phenomenon is explained with reference to FIG. 4. In the normal situation, the voltage $V_D$ appears at the base and emitter of transistor $Tr_1$. Therefore, a negative voltage, which renders the transistor $Tr_1$ conductive, does not appear at the base of the transistor $Tr_1$ so that the transistor $Tr_1$ remains in a non-conductive state, and the transistor $Tr_2$ also remains in a non-conductive state.

When, for example, external noise is applied to the COMS integrated circuit, electrons or holes appears on the substrate 12 and a current $i_o$ flows as shown in FIG. 4. Then, the base potential of the transistor $Tr_1$ decreases from $V_D$ to $V_D - \Delta V_B$, and a negative voltage $-\Delta V_B$ is applied to the base of the transistor $Tr_1$ so that the transistor $Tr_1$ is rendered conductive. By this conduction of the transistor $Tr_1$, a positive voltage is applied to the base of the transistor $Tr_2$ so that the transistor $Tr_2$ is rendered conductive. By this conduction of the transistor $Tr_2$, transistor $Tr_1$ remains conductive. By the repetition of the above-stated operation, the transistors $Tr_1$ and $Tr_2$ remain conductive, and currents $i_1$ and $i_2$ continuously flow. That is, the latch-up phenomenon occurs.

In the above explanation, current $i_o$ flows in the substrate 12 and transistor $Tr_1$ is first rendered conductive. However, there may be the case where current $i_o'$ flows in the P well 10 and transistor $Tr_2$ is first rendered conductive. That is, when current $i_o'$ flows as shown in FIG. 4, a positive base voltage appears at the base of the transistor $Tr_2$ and the transistor $Tr_2$ is thereby rendered conductive so that current $i_2$ flows. Then, a negative i.e.—the voltage (voltage drop of resistor $r_1$) is applied to the base of the transistor $Tr_1$ so that the transistor $Tr_1$ is rendered conductive and the current $i_1$ flows. By the repetition of the above-stated operation, the latch-up phenomenon occurs.

Figure 3:
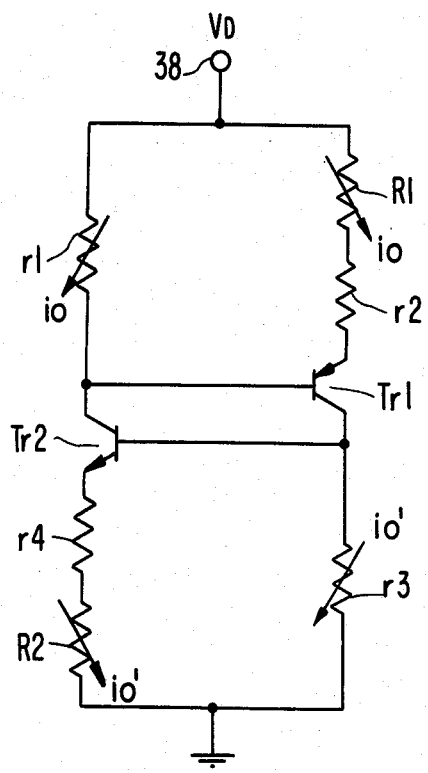
FIG. 3 is an equivalent circuit diagram of the CMOS integrated circuit of FIG. 2.

The embodiment of the invention shown in FIG. 1 and FIG. 2 includes a specific structure for preventing the occurrence of the latch-up phenomenon. That is, the above-stated resistors $R_1$ and $R_2$ function as a means for preventing the occurrence of latch-up phenomenon. The resistor $R_1$ is formed by the resistance which is produced by the substrate 12, in particular at the area between the N type impurity regions 30 and 32. The resistor $R_1$ is electrically inserted between the power supply terminal 38 and the resistor $r_2$ as shown in FIG. 3. On the other hand, the resistor $R_2$ is formed by resistance which produced by the P well 10, in particular at the area between the P type impurity regions 34 and 36. The resistor $R_2$ is electrically inserted between the resistor $r_4$ and ground. That is, the resistor $R_1$ is formed by the substrate 12 in which the resistor $r_1$ is formed, and the resistor $R_2$ is formed by the P well 10 in which the resistor $r_3$ is formed.

Because of such a structure, when the current $i_o$ flows due to external noise, etc., the current $i_o$ necessarily flows through resistor $R_1$. Therefore, when the base voltage is transistor $Tr_1$ drops to $V_D - \Delta V_B$, the emitter voltage of transistor $Tr_1$ drops from $V_D$ to $V_D - \Delta V_E$. As apparent from FIG. 2, resistor $R_1$ is larger than resistor $r_1$ because the distance of the area forming resistor $R_1$ is longer than that forming resistor $r_1$. Therefore, $\Delta V_B < \Delta V_E$, and $V_D - \Delta V_B > V_D - \Delta V_E$. A positive voltage is applied to the base of the transistor $Tr_1$, and the transistor $Tr_1$ remains non-conductive. Therefore, the latch-up phenomenon does not occur.

On the other hand, when the current $i_o'$ flows due to external noise, etc., the current $i_o'$ necessarily flows through resistor $R_2$. Therefore, when a positive voltage appears at the base of the transistor $Tr_2$, a higher positive voltage appears at the emitter of the transistor $Tr_2$, and base voltage of the transistor $Tr_2$ is negative so that it remains non-conductive. Therefore, the latch-up phenomenon does not occur.

Figure 5:
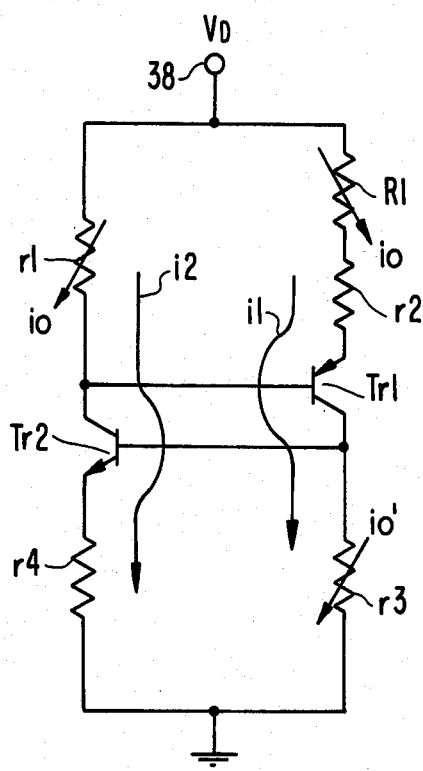
FIGS. 5 and 6 are equivalent circuit diagrams of other embodiments of a CMOS integrated circuit according to the present invention.
Figure 6:
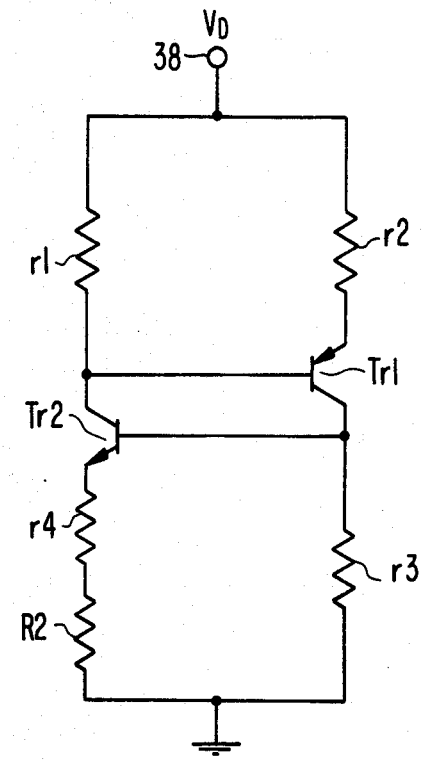

As explained above, the addition of two resistors $R_1$ and $R_2$ completely prevents the occurrence of the latch-up phenomenon. The resistance of these resistors $R_1$ and $R_2$ is easily adjustable. That is, if the distance between impurity regions 30, 32 or 34, 36 is increased, then the resistance of the resistors $R_1$ or $R_2$ is increased. If the distance is decreased, then the resistance is decreased. Therefore, it is easy to set the resistor $R_1$ or $R_2$ in such manner that transistor $Tr_1$ or $Tr_2$ is not rendered conductive. The above-stated advantage is also obtained by only one of resistors $R_1$ and $R_2$. FIG. 5 shows an embodiment which uses only resistor $R_1$ and FIG. 6 shows an embodiment which uses only resistor $R_2$. In FIG. 5, when the current $i_o$ flows, the transistor $Tr_1$ remains non-conductive to thereby prevent the occurrence of the latch-up phenomenon. On the other hand, when the current $i_o'$ flows, the transistor $Tr_2$ is rendered conductive and the transistor $Tr_1$ is rendered conductive, but the level of the current $i_1$ is limited by the existance of resistor $R_1$. Therefore, the base voltage $V_{BE}$ of the transistor $Tr_2$ becomes negative so that the transistor $Tr_2$ is rendered non-conductive. Therefore, the latch-up phenomenon does not occur.

The operation of the circuit shown in FIG. 6 is almost the same as that in FIG. 5 circuit. That is, resistor $R_2$ prevents the occurrence of the latch-up phenomenon. The detailed explanation of the operation of FIG. 6 is therefore omitted for the sake of brevity.

Figure 7:
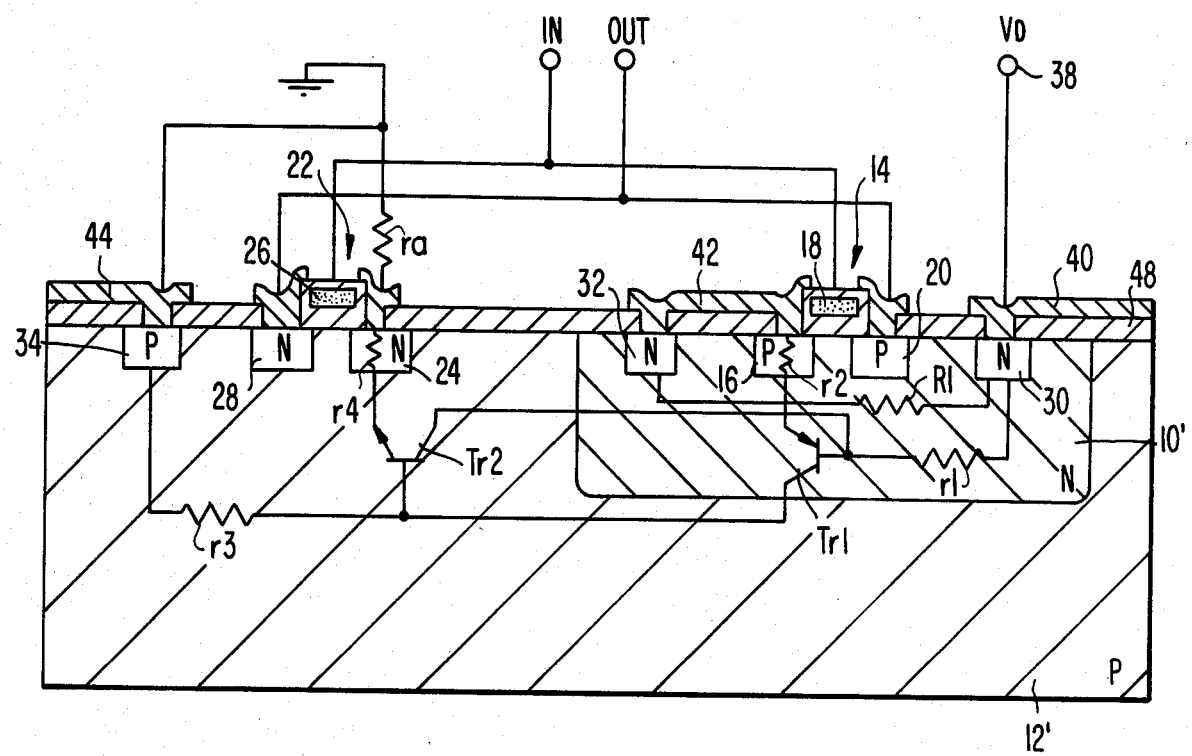
FIG. 7 is a sectional view of still another embodiment of a CMOS integrated circuit according to the present invention.
Figure 8:
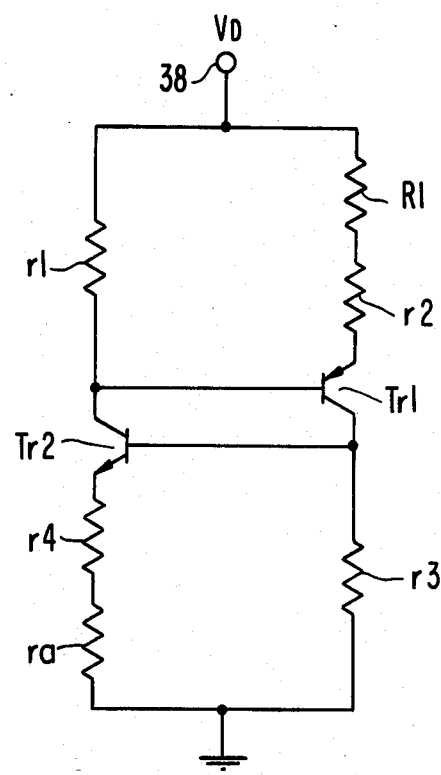
FIG. 8 is an equivalent circuit diagram of the CMOS integrated circuit of FIG. 7.

The above-stated embodiment uses the CMOS structure having P well formed in N type substrate. However, CMOS structure having an N well formed in a P type substrate is also usable. FIG. 7 shows one embodiment of the invention in which a CMOS structure having an N well formed in a P type substrate is used and only resistor $R_1$ which is formed in the N well 10' is used for preventing the occurrence of the latch-up phenomenon. In FIG. 7, the same numeral used in FIGS. 1 and 2 corresponds to the same component, and a detailed explanation is omitted for the sake of brevity. FIG. 8 shows an equivalent circuit of the FIG. 7 structure.

Further, in FIGS. 7 and 8, an additional resistor $r_a$ is electrically inserted between resistor $r_4$ and ground. The resistor $r_a$ is formed by a polysilicon film formed on the substrate 12 or by an impurity diffusion region formed in the substrate 12 or by a resistor attached to the CMOS integrated circuit. The resistor $r_a$ is used for limiting the current flowing through transistor $Tr_2$ to thereby further prevent the flow of a large current and to thereby prevent the occurrence of the latch-up phenomenon.

Figure 9:
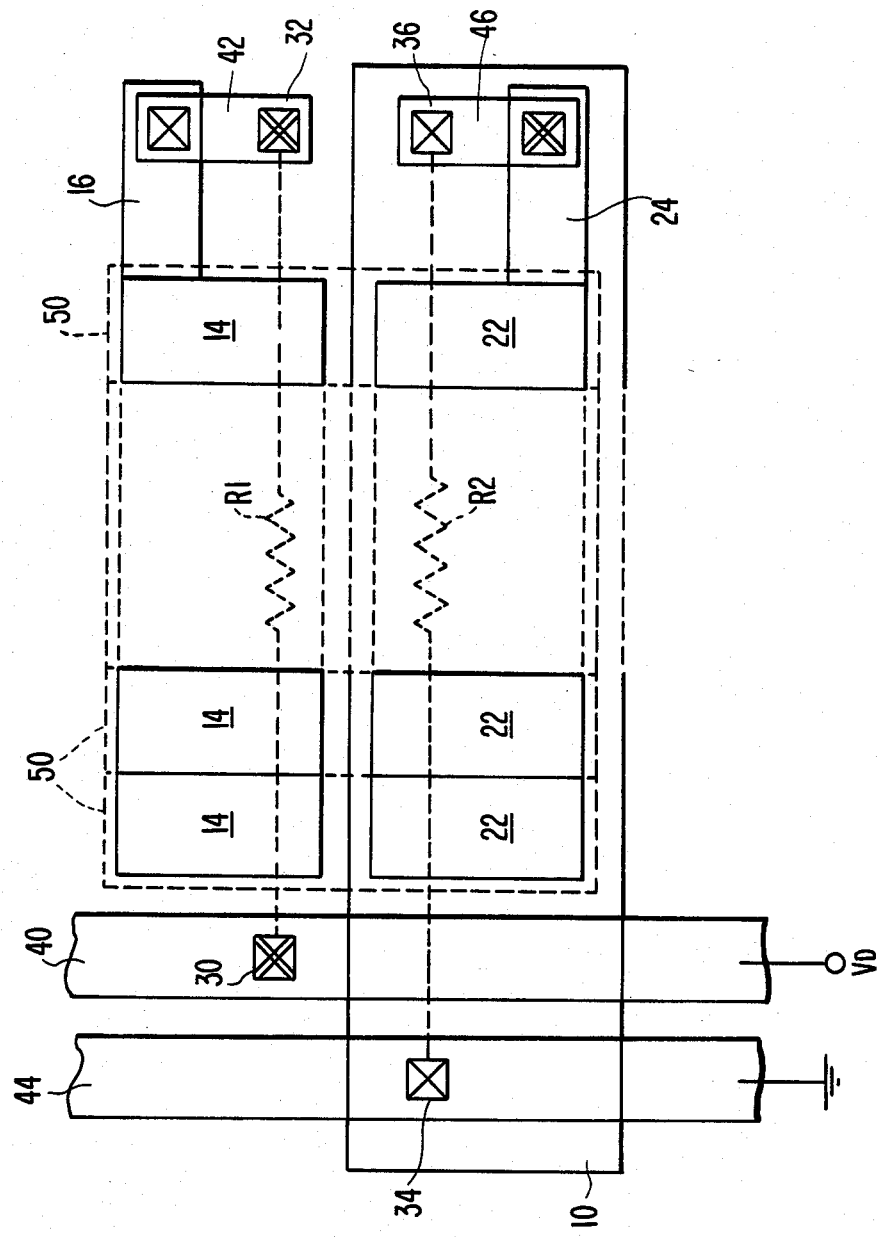
FIG. 9 is a schematic plan view of a CMOS memory device which is one of applications of the present invention.

FIG. 9 shows one of applications of the present invention, i.e., a semiconductor memory device. Each of the CMOS memory cells 50 is comprised of a P channel type MOS transistor 14 and an N channel type MOS transistor 22. A plurality of CMOS memory cells 50 are disposed in a horizontal direction so as to be aligned as shown in FIG. 9. These memory cells 50 are electrically connected to aluminum layers 40 and 44 through resistors $R_1$ and $R_2$. A common impurity region 16 of the P channel type transistors 14 is connected to the impurity region 32 through the aluminum layer 42. A common impurity region 24 of the N channel type transistors 22 is connected to the impurity region 36 through the aluminum layer 46. The aluminum layer 40 functions as a power supply line and the aluminum layer 44 functions as a ground line.

The above-stated resistor $R_1$ is formed by an area located between the aluminum layer 40, particularly between the impurity region 30 and the aluminum layer 42, particularly the impurity region 32. That is, the resistor $R_1$ is formed by a part of the substrate 12 which is located below the P channel type MOS transistor portion of the CMOS memory cells. The above-stated resistor $R_2$ is formed by an area located between the aluminum layer 44, particularly between the impurity region 34 and the aluminum layer 46, particularly the impurity region 36, i.e., by a part of the P well 10 which is located below the N channel type MOS transistor portion of the CMOS memory cells. The resistance of the resistors $R_1$ and $R_2$ are changed by changing the size of the memory cells 50 or by changing the number of memory cells disposed along a line in the horizontal direction. The above-stated CMOS memory device can be formed by a P type substrate having an N well, and one of the resistors $R_1$ and $R_2$ can be omitted.

What is claimed is:

1. A CMOS integrated circuit comprising:
  a semiconductor substrate of a first type of conductivity;
  an impurity region of a second type of conductivity which is formed in said semiconductor substrate;
  a first MOS transistor formed in said substrate;
  a second MOS transistor formed in said impurity region;
  a power supply means for supplying a voltage to said first and second transistors;
  a first contact region disposed in at least one of said substrate and said impurity region, said first contact region being connected to said power supply means;
  a second contact region disposed opposite to said first contact region via at least one of said first and second MOS transistors in at least one of said substrate and said impurity region, said second contact region being connected to at least one of said first and second MOS transistors; and at least one resistor formed between said first and second contact regions in at least one of said substrate and said impurity region at a position below at least one of said first and second transistors, said resistor being electrically inserted between said power supply means and at least one of said first and second transistors.

2. A CMOS integrated circuit as recited in claim 1, wherein said semiconductor substrate is of an N type, and said impurity region is of a P type, and said first MOS transistor is of a P-channel type, and said second MOS transistor is of an N-channel type.

3. A CMOS integrated circuit as recited in claim 1, wherein said semiconductor substrate is of a P type, and said impurity region is of an N type, and said first MOS transistor is of an N-channel type, and said second MOS transistor is of a P-channel type.

4. A CMOS integrated circuit as recited in claim 1, wherein said power supply means includes a power supply line and a ground line, and said power supply line is connected to said first MOS transistor through said resistor.

5. A CMOS integrated circuit as recited in claim 1, wherein said power supply means includes a power supply line and a ground line, and said ground line is connected to said second MOS transistor through said resistor.

6. A CMOS integrated circuit as recited in claim 1, wherein said power supply means includes a power supply line and a ground line, and said power supply line is connected to said first MOS transistor through a first resistor, and said ground line is connected to said second MOS transistor through a second resistor.

7. A CMOS integrated circuit as recited in claim 1, wherein said resistor is formed by use of a part of at least one of said substrate and said impurity region.

8. A CMOS integrated circuit as recited in claim 1, wherein said first and second MOS transistors form a complementary circuit.

9. A CMOS integrated circuit comprising:
a semiconductor substrate of a first type of conductivity which is formed in said semiconductor substrate;
a CMOS circuit including a first MOS transistor which is formed in said substrate and a second MOS transistor which is formed in said impurity region; and
a power supply means for supplying a voltage to said CMOS circuit, said power supply means being electrically connected to said CMOS circuit through a part of at least one of said substrate and said impurity region;
a first contact region disposed in at least one of said substrate and said impurity region, said first contact region being connected to said power supply means;
a second contact region disposed opposite to said first contact region via at least one of said first and second MOS transistors in at least one of said substrate and said impurity region, said second contact region being connected to at least one of said first and second MOS transistors; and
wherein said part of at least one of said substrate and said impurity region disposed between said first and second contact regions functions as a resistor for thereby preventing an occurrence of a latch-up phenomenon of said CMOS integrated circuit.

10. A CMOS integrated circuit as recited in claim 9, wherein said semiconductor substrate is of a P type, and said impurity region is an N well formed in said P type substrate, and said power supply means is electrically connected to said second MOS transistor through a part of said N well.

11. A CMOS integrated circuit as recited in claim 9, wherein said power supply means is electrically connected to said first MOS transistor through a part of said semiconductor substrate.

12. A CMOS integrated circuit comprising:
a P type silicon substrate;
an N well formed in said substrate;
a CMOS circuit including an N channel type MOS transistor which is formed in said substrate and a P channel type MOS transistor which is formed in said N well;
a power supply line to which a voltage is applied;
a terminal electrode formed in said N well away from said CMOS circuit portion, said electrode being electrically connected to said power supply line;
a first contact region disposed in at least one of said substrate and said impurity region, said first contact region being connected to said power supply line;
a second contact region disposed opposite to said first contact region via at least one of said first and second MOS transistors in at least one of said substrate and said impurity region, said second contact region being connected to at least one of said first and second MOS transistors; and
wherein a part of said N well located between said CMOS circuit portion and terminal electrode disposed between said first and second contact regions functions as a resistor for thereby preventing an occurrence of a latch-up phenomenon of said CMOS integrated circuit.

13. A CMOS integrated circuit as recited in claim 12, further comprising an external resistor which is electrically inserted between said CMOS circuit and ground.

14. A CMOS integrated circuit comprising:
an N type silicon substrate;
a P well formed in said substrate;
a CMOS circuit including a P channel type MOS transistor which is formed in said substrate and an N channel type MOS transistor which is formed in said P well;
a power supply line to which a voltage is applied;
a first terminal electrode formed in said substrate away from said CMOS circuit portion, said first electrode being electrically connected to said power supply line;
a second terminal electrode formed in said P well away from said CMOS circuit portion, said second terminal electrode being electrically connected to ground;
a first contact region disposed in at least one of said substrate and said impurity region, said first contact region being connected to said power supply line;
a second contact region disposed opposite to said first contact region via at least one of said first and second MOS transistors in at least one of said substrate and said impurity region, said second contact region being connected to at least one of said first and second MOS transistors; and wherein a part of said substrate formed between said first and second contact regions and located between said first terminal electrode and CMOS circuit portion, and a part of said P well formed bwteen said first and second contact regions and located between said CMOS circuit portion and second terminal electrode function as resistors for thereby preventing an occurrence of a latch-up phenomenon of said CMOS integrated circuit.

15. A semiconductor memory device comprising:
a semiconductor substrate and an impurity region, said substrate and region being of opposite conductivities;
a plurality of memory cells which are comprised of a CMOS structure and formed in said substrate; and
a power supply line for supplying a voltage to said memory cells, said power supply line being formed at a position away from said memory cells and electrically connected to said memory cells through a portion of said substrate which is located below said memory cells; a first contact region disposed in at least one of said substrates and said impurity regions, said first contact being connected to said power supply line; a second contact region disposed opposite to said first contact region in at least one of said substrate and said impurity regions, said second contact region being connected to said CMOS structure;
wherein said portion of said substrate which is formed between said first and second contact regions functions as a resistor for thereby preventing an occurrence of a latch-up phenomenon of said memory cells.

16. A semiconductor memory device as recited in claim 15, wherein said resistor is disposed below said memory cells.

* * * * *